United States Patent
Heiman et al.

(10) Patent No.: US 8,582,697 B2
(45) Date of Patent: *Nov. 12, 2013

(54) METHOD AND SYSTEM FOR DECODING SINGLE ANTENNA INTERFERENCE CANCELLATION (SAIC) AND REDUNDANCY PROCESSING ADAPTATION USING BURST PROCESS

(75) Inventors: Arie Heiman, Rannana (IL); Huaiyu (Hanks) Zeng, Red Bank, NJ (US); Jie Lai, Belle Mead, NJ (US); Yueheng Sun, Manalapan, NJ (US); Nelson Sollenberger, Farmingdale, NJ (US); Yossy Pruzanski, Ramat Gan (IL)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/614,338

(22) Filed: Sep. 13, 2012

(65) Prior Publication Data

US 2013/0010901 A1    Jan. 10, 2013

Related U.S. Application Data

(63) Continuation of application No. 12/880,827, filed on Sep. 13, 2010, now Pat. No. 8,306,159, which is a continuation of application No. 11/325,808, filed on Jan. 5, 2006, now Pat. No. 7,796,711.

(60) Provisional application No. 60/752,748, filed on Dec. 21, 2005.

(51) Int. Cl.
*H04L 27/06* (2006.01)

(52) U.S. Cl.
USPC .......................................... 375/341; 375/267

(58) Field of Classification Search
USPC .......... 375/341, 267, 316, 340, 262, 346–348
See application file for complete search history.

(56) References Cited

U.S. PATENT DOCUMENTS

| 7,387,528 | B2 | 6/2008 | Lee et al. |
| 7,512,199 | B2 | 3/2009 | Molev-Shteiman et al. |
| 7,529,297 | B2 | 5/2009 | Chen et al. |
| 7,535,980 | B2 | 5/2009 | Yang et al. |
| 7,552,575 | B1 | 6/2009 | Martin |
| 7,587,211 | B2 | 9/2009 | Zeng et al. |

(Continued)

OTHER PUBLICATIONS

Austin, Ph.D., "SAIC and Synchronized Networks for Increased GSM Capacity,", Cingular Wireless, SAIC Working Group, Sep. 2003, pp. 1-26.

*Primary Examiner* — Emmanuel Bayard
(74) *Attorney, Agent, or Firm* — Sterne, Kessler, Goldstein & Fox PLLC

(57) ABSTRACT

Aspects of a method and system for decoding single antenna interference cancellation (SAIC) and redundancy processing adaptation using burst process are provided. A wireless receiver may decode bit sequences based on a first decoding algorithm that may utilize redundancy in the data and that may impose physical constraints. The receiver may also decode a received bit sequence based on a second decoding algorithm that utilizes SAIC. Received data may be processed in a burst process portion in either decoding algorithm. Burst processed data from one of the decoding algorithms may be selected based on signal-to-noise ratio and/or received signal level measurements. The selected burst processed data may be communicated to a frame processing portion of the corresponding decoding algorithm.

21 Claims, 9 Drawing Sheets

(56) References Cited

U.S. PATENT DOCUMENTS

| | | |
|---|---|---|
| 7,593,368 B2 | 9/2009 | Zeng et al. |
| 7,620,013 B2 | 11/2009 | Zeng et al. |
| 7,643,993 B2 | 1/2010 | Heiman |
| 7,693,531 B2 | 4/2010 | Heiman |
| 7,706,481 B2 | 4/2010 | Heiman et al. |
| 7,716,565 B2 | 5/2010 | Heiman et al. |
| 7,796,711 B2 * | 9/2010 | Heiman et al. ............ 375/341 |
| 7,809,091 B2 | 10/2010 | Zeng et al. |
| 7,809,096 B2 | 10/2010 | Molev-Shteiman et al. |
| 8,046,662 B2 | 10/2011 | Heiman et al. |
| 8,306,159 B2 * | 11/2012 | Heiman et al. ............ 375/341 |
| 8,306,323 B2 * | 11/2012 | Sim ............................ 382/167 |
| 2005/0024956 A1 | 2/2005 | Tran et al. |
| 2005/0234500 A1 | 10/2005 | Chen et al. |

* cited by examiner

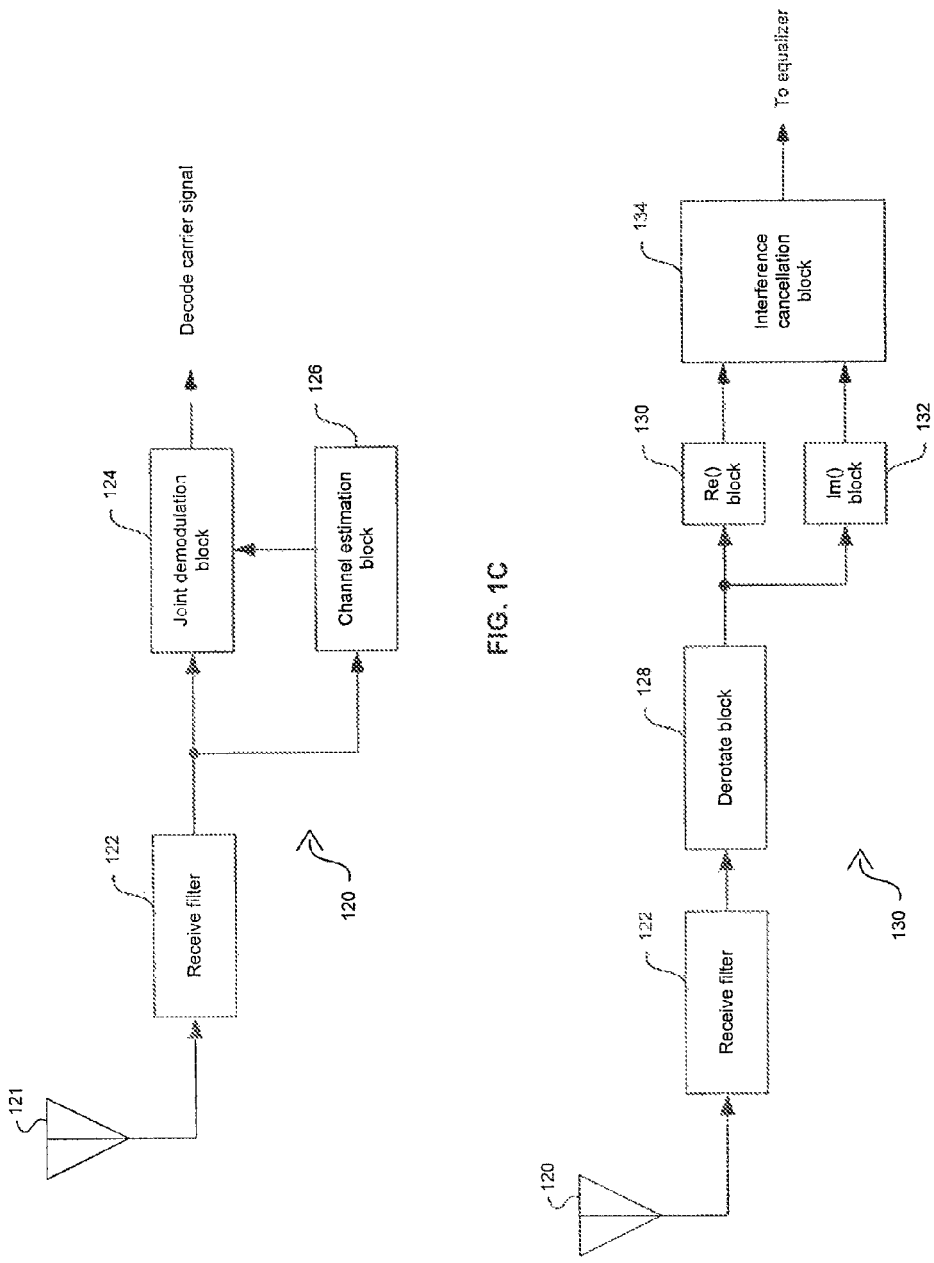

METHOD AND SYSTEM FOR DECODING SINGLE ANTENNA INTERFERENCE CANCELLATION (SAIC) AND REDUNDANCY PROCESSING ADAPTATION USING BURST PROCESS

CROSS-REFERENCE TO RELATED APPLICATIONS/INCORPORATION BY REFERENCE

The present application is a continuation of U.S. patent application Ser. No. 12/880,827, filed Sep. 13, 2010, now U.S. Pat. No. 8,306,159, which is a continuation of U.S. patent application Ser. No. 11/325,808, filed Jan. 5, 2006, now U.S. Pat. No. 7,396,711 which claims the benefit of U.S. Provisional Patent Application No. 60/752,748, filed Dec. 21, 2005, all of which are incorporated herein b reference in their entireties.

This application makes reference to:

U.S. application Ser. No. 11/325,721 filed on Jan. 5, 2006, now U.S. Pat. No. 7,643,993;
U.S. application Ser. No. 11/325,720 filed on Jan. 5, 2006, now U.S. Pat. No. 8,046,662;
U.S. application Ser. No. 11/325,751 filed on Jan. 5, 2006, now U.S. Pat. No. 7,809,091;
U.S. application Ser. No. 11/326,066 filed on Jan. 5, 2006, now U.S. Pat. No. 7,587,211;
U.S. application Ser. No. 11/325,997 filed on Jan. 5, 2006, now U.S. Pat. No. 7,620,013;
U.S. application Ser. No. 11/325,752 filed on Jan. 5, 2006, now U.S. Pat. No. 7,552,575;
U.S. application Ser. No. 11/325,756 filed on Jan. 5, 2006, now U.S. Pat. No. 7,593,368;
U.S. application Ser. No. 11/325,759 filed on Jan. 5, 2006, now U.S. Pat. No. 7,693,531;
U.S. application Ser. No. 11/189,509 filed on Jul. 26, 2005, now U.S. Pat. No. 7,716,565;
U.S. application Ser. No. 11/189,634 filed on Jul. 26, 2005, now U.S. Pat. No. 7,306,481;
U.S. application Ser. No. 11/150,926 filed on Jun. 13, 2005;
U.S. application Ser. No. 11/271,692 filed on Nov. 10, 2005, now U.S. Pat. No. 7,529,297;
U.S. application Ser. No. 11/159,931 filed on Jun. 13, 2005, now U.S. Pat. No. 7,387,528;
U.S. application Ser. No. 11/150,957 filed on Jun. 13, 2005, now U.S. Pat. No. 7,809,096;
U.S. application Ser. No. 11/151,029 filed on Jun. 13, 2005, now U.S. Pat. No. 7,512,199; and
U.S. application Ser. No. 11/151,030 filed on Jun. 13, 2005, now U.S. Pat. No. 7,535,980.

Each of the above stated applications is hereby incorporated herein by reference in its entirety.

FIELD OF THE INVENTION

Certain embodiments of the present invention relate to processing of signals by receivers in wired and wireless communication systems. More specifically, certain embodiments relate to a method and system for decoding single antenna interference cancellation (SAIC) and redundancy processing adaptation using burst process.

BACKGROUND OF THE INVENTION

In some conventional receivers, improvements in performance may require extensive system modifications that may be very costly and, in some cases, may even be impractical. Determining the right approach to achieve design improvements may depend on the optimization of a receiver system to a particular modulation type and/or to the various kinds of noises that may be introduced by a transmission channel. For example, the optimization of a receiver system may be based on whether the signals being received, generally in the form of successive symbols or information bits, are interdependent. Signals received from, for example, a convolutional encoder, may be interdependent signals, that is, signals with memory. In this regard, a convolutional encoder may generate NRZI or continuous-phase modulation (CPM), which is generally based on a finite state machine operation.

One method or algorithm for signal detection in a receiver system that decodes convolutional encoded data is maximum-likelihood sequence detection or estimation (MLSE). The MLSE is an algorithm that performs soft decisions while searching for a sequence that minimizes a distance metric in a trellis that characterizes the memory or interdependence of the transmitted signal. In this regard, an operation based on the Viterbi algorithm may be utilized to reduce the number of sequences in the trellis search when new signals are received.

Another method or algorithm for signal detection of convolutional encoded data that makes symbol-by-symbol decisions is maximum a posteriori probability (MAP). The optimization of the MAP algorithm is based on minimizing the probability of a symbol error. In many instances, the MAP algorithm may be difficult to implement because of its computational complexity.

Another historical approach to improve the performance of receivers that may require extensive system modifications is to reduce the effect of interference by using multiple antennas, often referred to as receive or antenna diversity. The benefits of diversity increase with the number of antennas that may be used. Moreover, the more uncorrelated that the antennas are to each other through appropriate spacing, the better the performance improvement of the system. However, receiving signals from multiple antennas increases hardware and/or software complexity resulting in higher implementation costs.

Improvements in the design and implementation of optimized receivers for decoding convolutional encoded data may require modifications to the application of the MLSE algorithm, the Viterbi algorithm, and/or the MAP algorithm in accordance with the modulation method utilized in signal transmission. Moreover, optimized receivers may also need to implement techniques that enable the reduction of signal interference without extensive and costly increases in hardware and/or software complexity.

Multilayer processing may be utilized to optimize portions of a receiver's processing more efficiently. However, when decoding improvements comprise a plurality of techniques, it may be difficult to construct an appropriate multilayer implementation that achieves the required design improvements with minimum hardware and/or software complexity.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for decoding single antenna interference cancellation (SAIC) and redundancy processing adaptation using burst process, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 1C is a block diagram illustrating an exemplary implementation of a joint demodulation algorithm for single antenna interference cancellation, in connection with an embodiment of the invention.

FIG. 1D is a block diagram illustrating an exemplary implementation of a blind interference cancellation algorithm for single antenna interference cancellation, in connection with an embodiment of the invention.

DETAILED DESCRIPTION OF THE INVENTION

Certain embodiments of the invention may be found in a method and system for decoding single antenna interference cancellation (SAIC) and redundancy processing adaptation using burst process. Aspects of the method and/or system may comprise a wireless receiver that may be enabled to decode video, voice, and/or speech bit sequences based on a first decoding algorithm that may utilize redundancy in the data and that may impose physical constraints. The receiver may also decode a received bit sequence based on a second decoding algorithm that utilizes single antenna interference cancellation. Received data may be processed in a burst process portion in either decoding algorithm. Burst processed data from one of the decoding algorithms may be selected based on signal-to-noise ratio and/or received signal level measurements. The selected burst processed data may be communicated to a frame processing portion of the corresponding decoding algorithm.

Figure 1A:
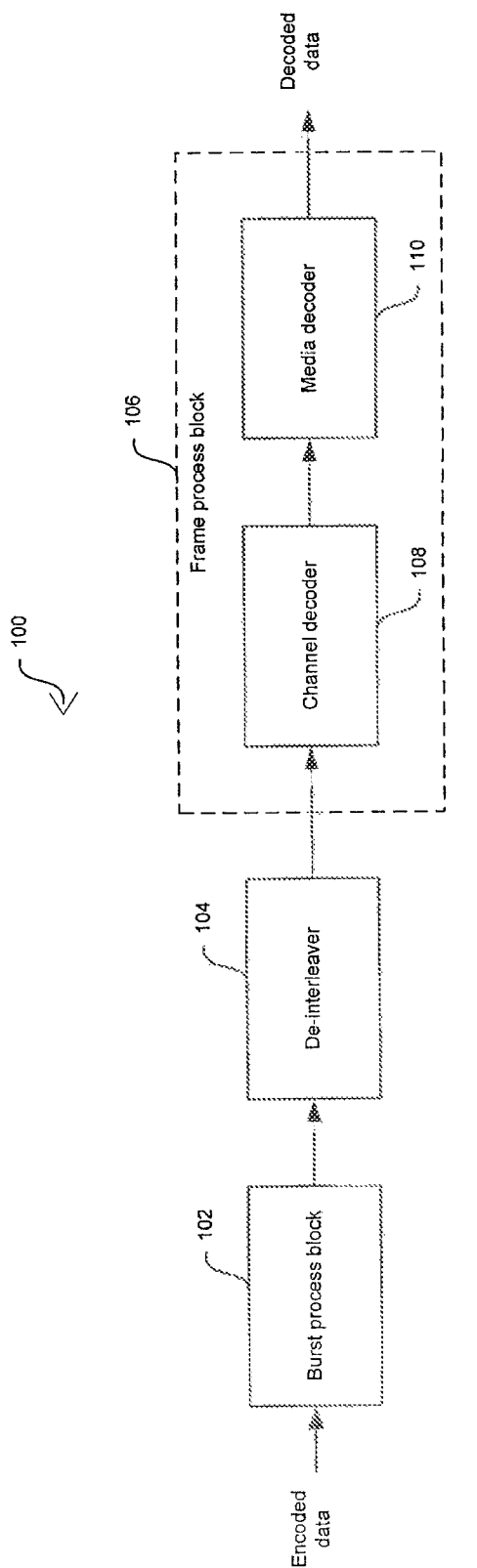
FIG. 1A is a block diagram illustrating a multilayer system for improving decoding, in accordance with an embodiment of the invention.

FIG. 1A is a block diagram illustrating a multilayer system for improving decoding, in accordance with an embodiment of the invention. Referring to FIG. 1A, there is shown a receiver 100 that comprises a burst process block 102, a de-interleaver 104, and a frame process block 106. The frame process block 106 may comprise a channel decoder 108 and a media decoder 110. The receiver 100 may comprise suitable logic, circuitry, and/or code that may enable the processing of received signals. The received signals may be, for example, interdependent signals or signals with memory. In this regard, the receiver 100 may be enabled to utilize redundancy to decode interdependent signals such as signals that comprise convolutional encoded data, for example. The decoding of interdependent signals may be referred to as redundancy-based decoding. The U.S. application Ser. No. 11/189,509 filed on Jul. 26, 2005, discloses a method and system for decoding video, voice, and/or speech data using redundancy, and is hereby incorporated herein by reference in its entirety.

Redundancy-based decoding algorithms may utilize redundancy and physical constraints embedded in video, voice, and/or speech data. For certain data formats, for example, the inherent redundancy of the physical constraints may result from the packaging of the data and the generation of a redundancy verification parameter, such as a cyclic redundancy check (CRC), for the packaged data. For speech applications, for example, physical constraints may include gain continuity and smoothness in inter-frames or intra-frames, pitch continuity in voice inter-frames or intra-frames, and/or consistency of line spectral frequency (LSF) parameters that may be utilized to represent a spectral envelope.

The receiver 100 may be enabled to perform a burst process (BP) operation and a frame process (FP) operation when processing the received signals. The receiver 100 may also be enabled to utilize a multilayer approach for improving the decoding of received signals. In this regard, results obtained in the frame process operation may be utilized to improve the performance of the burst process operation. The multilayer approach performed by the receiver 100 may be compatible with a plurality of modulation standards, for example.

The receiver 100 may also enable performing single antenna interference cancellation (SAIC) algorithms when utilized in wireless applications, for example. In this regard, SAIC may refer to a technique for the cancellation of interference associated with received data communications processed by a wireless terminal within a wireless communication system. The U.S. application Ser. No. 11/150,926 filed on Jun. 13, 2005, discloses a single antenna interference cancellation within a wireless terminal, and is hereby incorporated herein by reference in its entirety.

The burst process block 102 may comprise suitable logic, circuitry, and/or code that may enable performing a burst process portion of a decoding operation of the receiver 100. In this regard, the burst process block 102 may be enabled to perform burst process operations for redundancy-based decoding and/or for SAIC operations. The burst process block 102 may comprise, for example, a channel estimation operation and a channel equalization operation. Results from the channel estimation operation may be utilized by the channel equalization operation to generate a plurality of data bursts based on a maximum-likelihood sequence estimation (MLSE) operation, for example. The output of the burst process block 102 may be transferred to the de-interleaver 104. The de-interleaver 104 may comprise suitable logic, circuitry, and/or code that may enable the multiplexing of bits from a plurality of data bursts received from the burst process block 102 to form the frame inputs to the frame process block 106. Interleaving may be utilized to reduce the effect of channel fading distortion, for example.

The channel decoder 108 may comprise suitable logic, circuitry, and/or code that may enable decoding of the bit sequences in the input frames received from the de-interleaver 104. The channel decoder 108 may be enabled to utilize the Viterbi algorithm during a Viterbi operation to improve the decoding of the input frames. The media decoder 110 may comprise suitable logic, circuitry, and/or code that may enable performing content specific processing operations on the results of the channel decoder 108 for specified applications such as MPEG-4, enhanced full-rate (EFR) or adaptive multi-rate (AMR) speech coder used in global system for mobile (GSM) communications, and/or MP3, for example. In this regard, the media decoder 110 may be enabled to support for a plurality of specified applications.

Regarding the frame process operation of the receiver 100, a standard approach for decoding convolution encoded data is to find the maximum-likelihood sequence estimate (MLSE) for a bit sequence. This may involve searching for a sequence X in which the conditional probability P(X/R) is a maximum, where X is the transmitted sequence and R is the received sequence, by using, for example, the Viterbi algorithm. In some instances, the received signal R may comprise an inherent redundancy as a result of the encoding process by the signals source. This inherent redundancy may be utilized in the decoding process by developing a MLSE algorithm that may be enabled to meet at least some of the physical constrains of the signals source. The use of physical constraints in the MLSE may be expressed as finding a maximum of the conditional probability P(X/R), where the sequence X meets a set of physical constrains C(X) and the set of physical constrains C(x) may depend on the source type and on the application. In this regard, the source type may be a voice, music and/or a video source type.

Figure 1B:
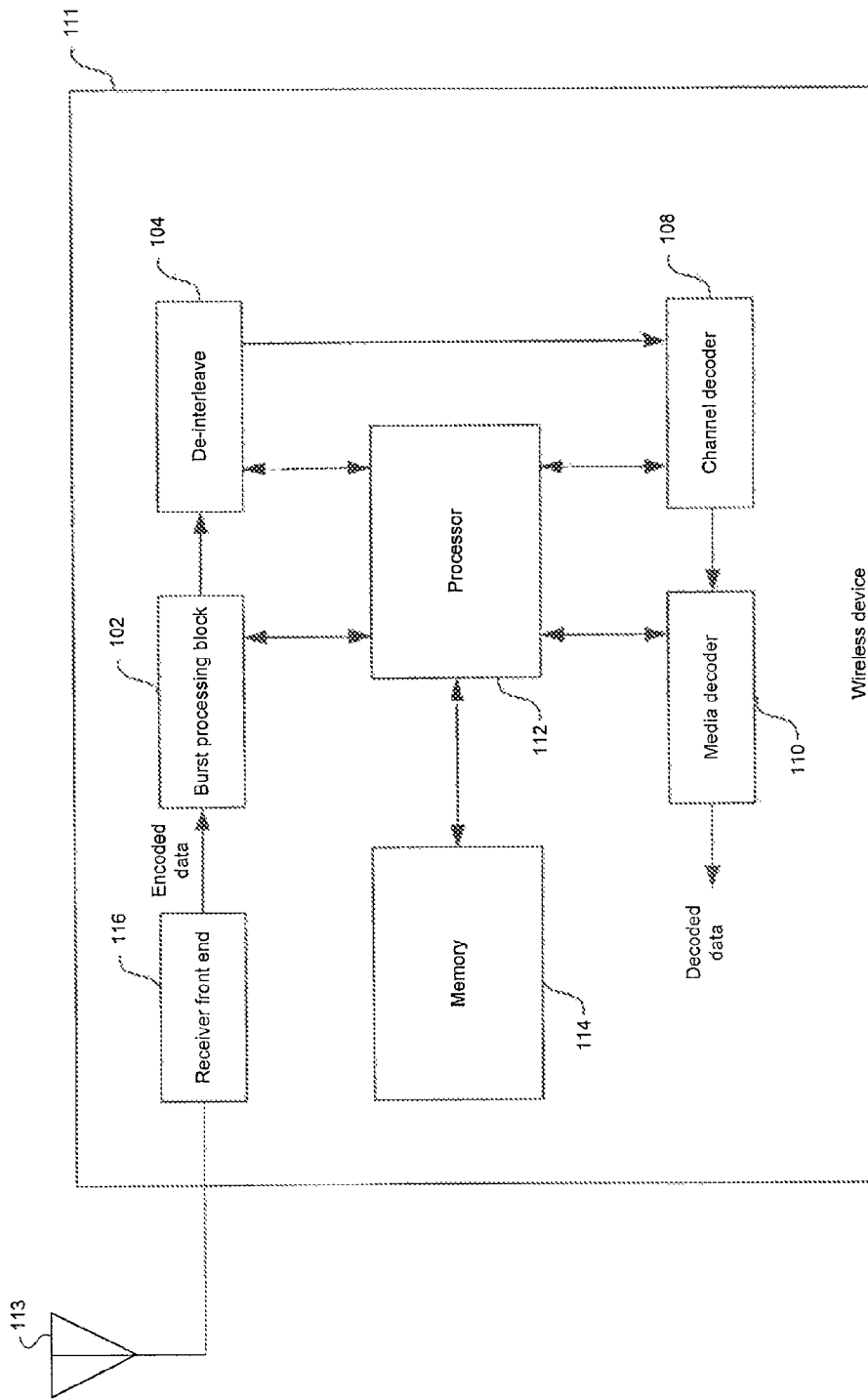
FIG. 1B is a block diagram illustrating a multilayer system with a processor and memory for improving decoding, in accordance with an embodiment of the invention.

FIG. 1B is a block diagram illustrating a multilayer system with a processor and memory for improving decoding, in accordance with an embodiment of the invention. Referring to FIG. 1B, there is shown a wireless device 111 that may comprise a receiver front end 116, a processor 112, a memory 114, the burst process block 102, the de-interleaver 104, the channel decoder 108, and the media decoder 110. The wireless device 111 may be enabled to perform SAIC algorithms and/or redundancy-based decoding algorithms.

The receiver front end 116 may comprise suitable logic, circuitry, and/or code that may enable receiving bit sequences from the antenna 113 and processing the received bit sequences for further processing by the burst processing block 102. In this regard, the receiver front end 116 may enable analog and/or digital processing of the data received from the antenna 113.

The processor 112 may comprise suitable logic, circuitry, and/or code that may enable performing computations and/or management operations. The processor 112 may also be enabled to communicate and/or control at least a portion of the operations of the burst process block 102, the de-interleaver 104, the channel decoder 108 and the media decoder 110. The memory 114 may comprise suitable logic, circuitry, and/or code that may enable storage of data and/or control information. The memory 114 may be enabled to store information that may be utilized and/or that may be generated by the burst process block 102, the de-interleaver 104, the channel decoder 108 and the media decoder 110. In this regard, information may be transferred to and from the memory 114 via the processor 112, for example.

FIG. 1C is a block diagram illustrating an exemplary implementation of a joint demodulation (JD) algorithm for SAIC, in connection with an embodiment of the invention. Referring to FIG. 1C, there is shown a portion of a receiver 120 that may comprise a single antenna 121, a receive filter 122, a joint demodulation block 124, and a channel estimation block 126. The portion of the receiver 120 shown in FIG. 1C may correspond to an implementation of a portion of the wireless device 111 in FIG. 1B, for example. The receiver 120 may be enabled to process a carrier signal and an interference or interfering signal. The received signals may correspond to multiple copies of the transmitted signal at different amplitudes and time delays, for example. The receiver 120 may utilize training sequence codes (TSCs) that may change in time and amplitude when arriving at the receiver to characterize the multi-path delay profile of the transmission channel for both the carrier signal and the interfering signal. Characterization of the interfering signal transmission channel is performed to cancel at least a portion of the interfering signal at the receiver 120.

The receive filter 122 may comprise suitable logic, circuitry, and/or code that may enable the filtering of a portion of the interfering signal from the carrier signal, for example. The filtered signal may be communicated to the joint demodulation block 124 and to the channel estimation block 126. The channel estimation block 126 may comprise suitable logic, circuitry, and/or code that may enable dynamic determination of the multi-path delay profile of the transmission channel. The joint demodulation block 124 may comprise suitable logic, circuitry, and/or code that may enable the carrier signal bit sequence estimation by utilizing a Viterbi equalizer, for example.

FIG. 1D is a block diagram illustrating an exemplary implementation of a blind interference cancellation (BIC) algorithm for SAIC, in connection with an embodiment of the invention. Referring to FIG. 1D, there is shown a portion of a receiver 130 that may comprise a single antenna 121, a receive filter 122, a derotate block 128, a real component (Re) block 130, an imaginary component (Im) block 132, and an interference cancellation block 134. The portion of the receiver 130 shown in FIG. 1D may correspond to an implementation of a portion of the wireless device 111 in FIG. 1B, for example.

The receiver 130 may be enabled to determine the multi-path delay profile of the transmission channel for the carrier signal. In this regard, the operation of the receiver 130 may be referred to as blind because there is no attempt by the receiver 130 to determine or estimate the channel of the interfering signal for canceling the interfering signal. The receiver 130 may utilize the known characteristics of, for example, Gaussian Minimum Shift Keying (GMSK) modulated signals, to separate the desired signal from the interfering signal before attempting to recover the desired signal. In this regard, some of the properties of GMSK signal may enable the receiver 130 to process the received signal to obtain a virtual signal that may correspond to a signal received from a "virtual second antenna". After the virtual signal is generated, a plurality of multiple antenna interference cancellation techniques may be utilized to cancel or suppress the interfering signal.

The derotate block 128 may comprise suitable logic, circuitry, and/or code that may enable the generation of a rotated signal from the received signal. Rotating the phase of the received signal by utilizing, for example, a CORDIC algorithm, may generate the rotated signal. The rotated signal may be communicated to the Re( ) block 130 where the real component of the signal may be obtained. The rotated signal may also be communicated to the Im( ) block 132 where the imaginary component of the signal may be obtained. The interference cancellation block 134 may comprise suitable logic, circuitry, and/or code that may enable the operation of at least one of the multiple antenna interference cancellation techniques that may be utilized to cancel or suppress the interfering signal. The output of the interference cancellation block 134 may be communicated to an equalizer, such as a Viterbi equalizer, for example.

Figure 2:
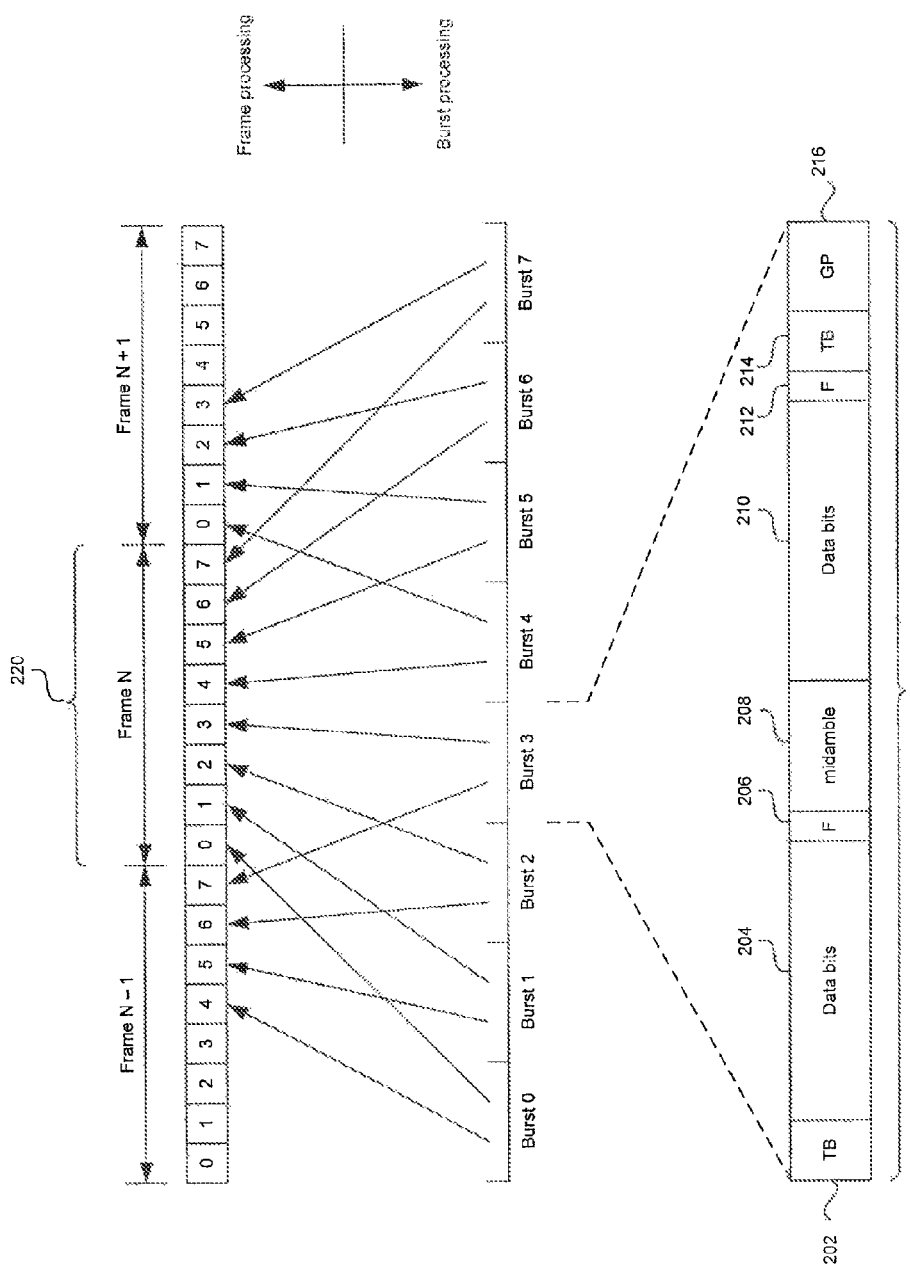
FIG. 2 is a diagram illustrating exemplary combined frame and burst processes in GSM applications, in accordance with an embodiment of the invention.

FIG. 2 is a diagram illustrating exemplary combined frame and burst processes in GSM applications, in accordance with an embodiment of the invention. Referring to FIGS. 1A and 2, there is shown a series of at least one time slot burst 200 and a series of at least one frame 220. The series of at least one time slot burst 200, as shown, may correspond to Burst 0 through Burst 7, while the series of at least one frame 220, as shown, may correspond to Frame N−1 through Frame N+1. The series of at least one time slot burst 200 may be generated during the burst processing operation of the receiver 100, for example, while the series of at least one frame 220 may be generated during the frame processing of the receiver 100, for example. The time slot burst 200 may comprise a tail bit (TB) 202, first data bits 204, a flag bit (F) 206, a midamble 208, second data bits 210, a flag bit (F) 212, a tail bit (TB) 214, and guard bits (GP) 216. The TB 202 and the TB 214 may comprise 3 bits each. The first data bits 204 and the second data bits 210 may comprise 57 bits each. The F 206 and the F 212 flag bits may comprise 1 bit each. The midamble 208 may comprise 26 bits and may be utilized as a training sequence for channel equalization, for example. The frame 220 may comprise eight partitions or sequences of bits, for example.

As shown, the first data bits 204 in the Burst 0 through Burst 3 may be transferred or communicated to the fifth, sixth, seventh, and eight sequences of the Frame N−1 respectively, for example. The first data bits 204 in the Burst 4 through Burst 7 may be transferred or communicated to the fifth, sixth, seventh, and eight sequences of the Frame N respectively, for example. The second data bits 210 in the Burst 0 through Burst 3 may be transferred or communicated to the first, second, third, and fourth sequences of the Frame N respectively, for example. The second data bits 210 in the Burst 4 through Burst 7 may be transferred or communicated to the first, second, third, and fourth sequences of the Frame N+1 respectively, for example. The decoding of bit sequences transferred or communicated from the time slot bursts in the burst processing to the frames in the frame processing may be performed by utilizing the Viterbi algorithm to reduce the number of sequences utilized during the decoding search. In this regard, utilizing signal redundancy and at least one physical constraint may result in a more accurate decoding operation. Moreover, burst processing and frame processing operations may be performed that may be consistent with single antenna interference cancellation operations supported by the receiver 100. While the burst structure described in FIG. 2 corresponds to that of a GSM burst, the receiver 100 may also support other burst structures.

Figure 3A:
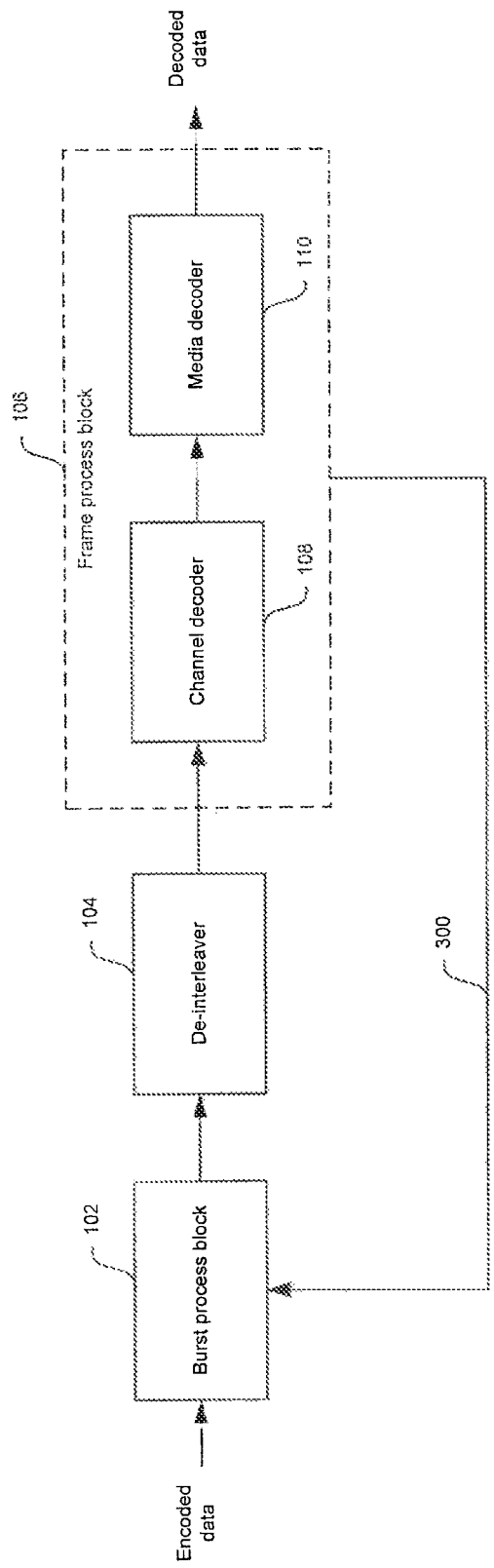
FIG. 3A is a block diagram illustrating an iterative multilayer approach for improving decoding, in accordance with an embodiment of the invention.

FIG. 3A is a block diagram illustrating an iterative multilayer approach for improving decoding, in accordance with an embodiment of the invention. Referring to FIG. 3A, there is shown the receiver 100 in FIG. 1A with a feedback signal from the frame process portion of the multilayer decoding approach to the burst process portion of the multilayer decoding approach. For redundancy-based decoding, the frame process may comprise the use of redundancy verification of the results generated by the Viterbi algorithm and the use of physical constraints to reduce decoding errors that may result from the standard Viterbi algorithm. For SAIC operations, the frame process may also be utilized to reduce decoding errors. The burst process may then utilize information decoded in the frame process as an input to improve the channel estimation and channel equalization operations, for example. The U.S. application Ser. No. 11/189,634 filed on Jul. 26, 2005, discloses a method and system for improving reception in wired and wireless receivers through redundancy and iterative processing, and is hereby incorporated herein by reference in its entirety.

Figure 3B:
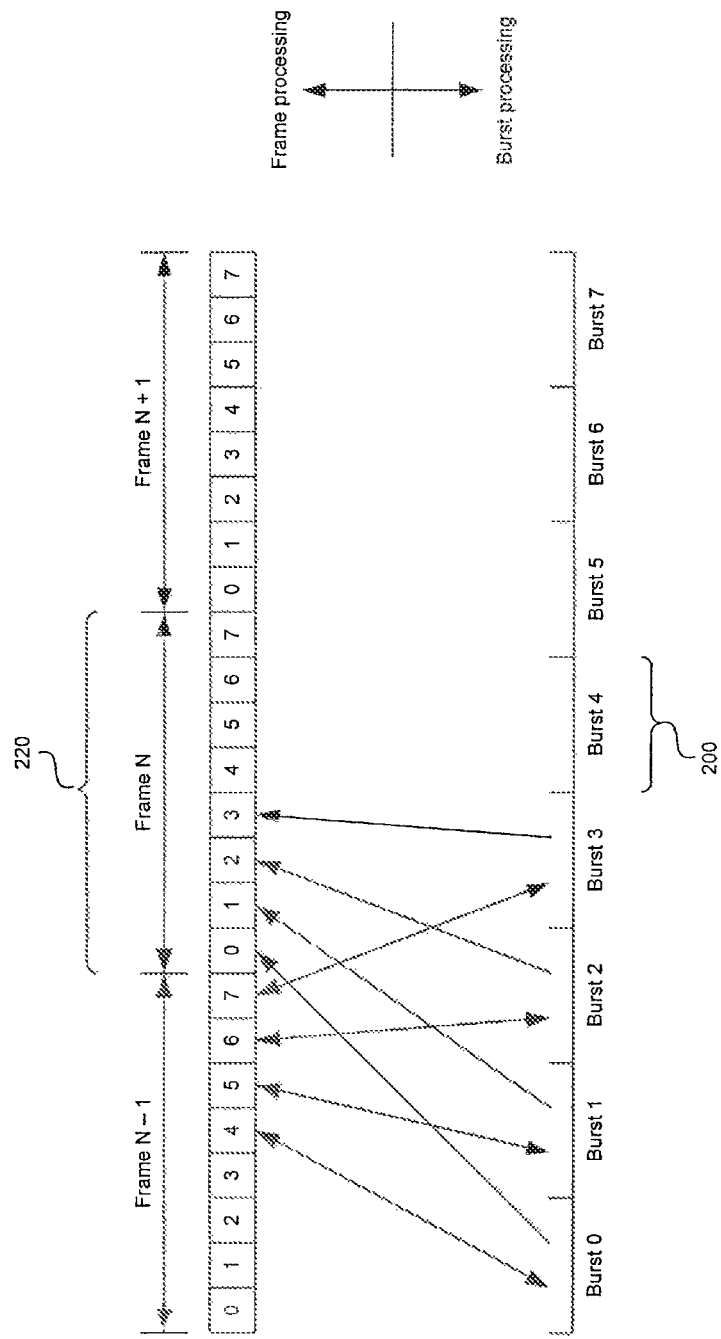
FIG. 3B is a diagram illustrating exemplary iterative frame and burst processes in GSM applications, in accordance with an embodiment of the invention.

FIG. 3B is a diagram illustrating exemplary iterative frame and burst processes in GSM applications, in accordance with an embodiment of the invention. Referring to FIG. 3B, there is shown a series of at least one time slot burst 200 and a series of at least one frame 220 as illustrated in FIG. 2. The series of at least one time slot burst 300 may correspond to Burst 0 through Burst 7, while the series of at lest one frame 320 may correspond to Frame N−1 through Frame N+1.

There may be two types of iterative processes to consider: a causal iterative process and a non-causal iterative process. For the causal iterative process, Burst 0 through Burst 3 may each have 57 data bits from the first data bits 204 portion of the time slot burst 200 that have been decoded during the frame processing of Frame N−1. Utilizing the decoded 57 data bits in each of Burst 0 through Burst 3 and the 26 bits in the midamble 208, the burst process may be recalculated or a second iteration of the burst process may occur. In this regard, the channel estimation operation of the burst process may be improved by utilizing the decoded data bits generated by the frame process during a second iteration. Moreover, the MLSE in the channel equalization operation of the burst process may consider that the decoded data bits are known with a higher probability than during the first iteration. In some instances, to reduce the complexity that may be introduced by a second iteration operation, the burst process may enable performing a second iteration on selected time slot bursts determined during the first iteration. In this regard, a particular time slot burst may be selected for a second iteration when it is associated with having a low carrier-to-interference (C/I) value, for example. Once the burst process improves the data, it may be further interleaved and processed by the frame process. The frame process my use a standard frame process or determine the best sequence based on, for example, the redundancy and/or by utilizing single antenna interference cancellation operations.

For the non-causal iterative process, bits from Burst 0 through Burst 7 may be needed to recalculate the burst process for bit sequences that may be transferred to Frame N. Data from Frame N−1 and/or data from Frame N+1 may be utilized to calculate the burst process for bit sequences that may be transferred to Frame N. Utilizing the decoded 114 data bits in each of Burst 0 through Burst 7 and the 26 bits in the midamble 208, the burst process may be recalculated. As with the causal iterative process, a particular time slot burst may be selected for a second iteration when it is associated with having a low carrier-to-interference (C/I) value, for example.

While the iterative processes described in FIG. 3B may be utilized for GSM bursts, the iterative processes may also be implemented for other burst structures, such as for wideband code division multiple access (WCDMA), for example.

Figure 4:
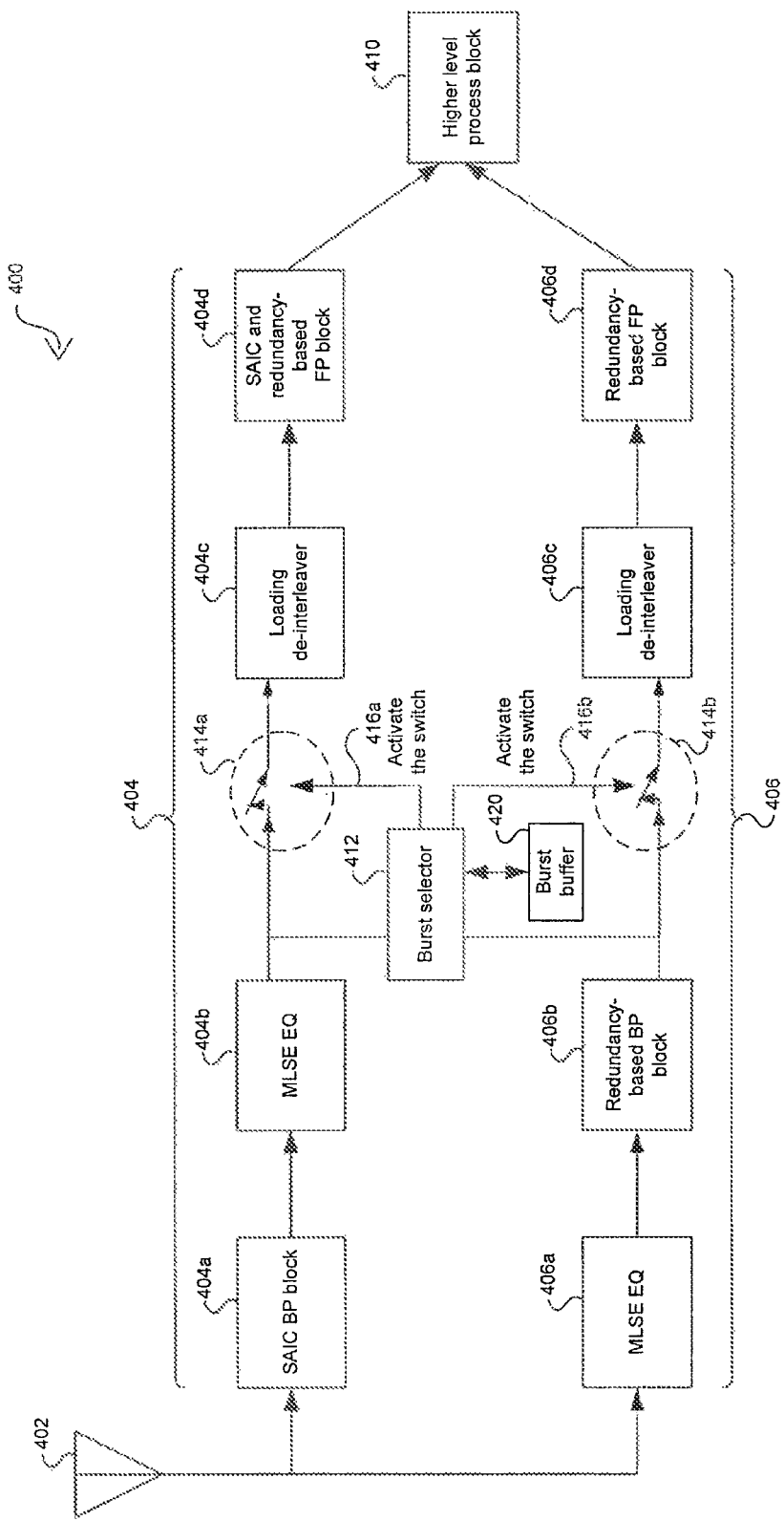
FIG. 4 is a block diagram illustrating an exemplary parallel adaptation of SAIC and redundancy-based decoding algorithms with a burst selector, in accordance with an embodiment of the invention.

FIG. 4 is a block diagram illustrating an exemplary parallel adaptation of SAIC and redundancy-based decoding algorithms with a burst selector, in accordance with an embodiment of the invention. Referring to FIG. 4, there is shown a portion of a wireless receiver 400 that may comprise a single antenna 402, a single antenna interference cancellation (SAIC) decoding path 404, a redundancy-based decoding path 406, a burst selector 412, a burst buffer 420, a first switch 414a, a second switch 441b, and a higher level process block 410. The redundancy-based decoding path 406 may provide robust decoding for a plurality of channel conditions and may generally provide a uniform gain when compared to conventional receivers, for example. The SAIC decoding path 404 may provide better interference cancellation performance when interference is dominant in the transmission channel, for example.

The SAIC decoding path 404 may comprise a SAIC burst process (BP) block 404a, a maximum-likelihood sequence estimation (MLSE) equalizer (EQ) 404b, a loading de-interleaver 404c, and a SAIC and redundancy-based frame process (FP) block 404d. In some instances, the SAIC decoding path 404 may also utilize a standard Viterbi decoder, for example. The SAIC BP block 404a may comprise suitable logic, circuitry, and/or code that may enable processing of bit sequence bursts communicated from the antenna 402, for example. The MLSE EQ 404b may comprise suitable logic, circuitry, and/or code that may enable equalization of the processed bit sequence bursts from the SAIC BP block 404a. The output of the MLSE EQ 404b may be communicated to the first switch 414a and/or to the burst selector 412. The first switch 414a may comprise suitable logic, circuitry, and/or code that may enable communicating the processed burst from the MLSE EQ 404b to the loading de-interleaver 404c when the first switch 414a is activated. Moreover, processed bursts stored in the burst buffer 420 may be communicated to the loading de-interleaver 404c via the burst selector 412 and the first switch 414a, for example. The first switch 414a may be activated by a signal, such as the signal 416a generated by the burst selector 412, for example.

The loading de-interleaver 404c may comprise suitable logic, circuitry, and/or code that may enable multiplexing of bits from a plurality of data bursts loaded via the first switch 414a. The SAIC and redundancy-based FP block 404d may comprise suitable logic, circuitry, and/or code that may enable support for frame processing for decoding bit sequences in SAIC algorithms and for frame processing for decoding bit sequences in redundancy-based algorithms. For voice data processing, for example, frame processing may enable decoding of a block using 8 bursts of data for full rate voice channels or 4 bursts of data for half rate voice channels. The SAIC and redundancy-based FP block 404d may also enable the generation of a redundancy verification parameter, such as a CRC, or continuity and smoothness of the speech parameters, for example, for the decoded bit sequence. The SAIC and redundancy-based FP block 404d may support iterative processing by communicating a portion of the frame processing results back to the SAIC BP block 404a as described in FIGS. 3A and 3B, for example. The decoded bit sequence generated by the SAIC and redundancy-based FP block 404d may be communicated to the higher level process block 410 for further processing.

The redundancy-based decoding path 406 may comprise an MLSE EQ 406a, a redundancy-based BP block 406b, a loading de-interleaver 406c, and a redundancy-based FP block 406d. The MLSE EQ 406a may comprise suitable logic, circuitry, and/or code that may enable equalization of the bit sequence bursts communicated from the antenna 402. The redundancy-based BP block 406b may comprise suitable logic, circuitry, and/or code that may enable processing of bit sequence bursts received from the MSLE EQ 406a. The output of the redundancy-based BP block 406b may be communicated to the second switch 414b and/or to the burst selector 412. The second switch 414b may comprise suitable logic, circuitry, and/or code that may enable communicating the processed burst from the redundancy-based BP block 406b to the loading de-interleaver 406c when the second switch 414b is activated. Moreover, processed bursts stored in the burst buffer 420 may be communicated to the loading de-interleaver 406c via the burst selector 412 and the second switch 414b, for example. The second switch 414b may be activated by a signal, such as the signal 416b generated by the burst selector 412, for example.

The loading de-interleaver 406c may comprise suitable logic, circuitry, and/or code that may enable multiplexing of bits from a plurality of data bursts loaded via the second switch 414b. The redundancy-based FP block 406d may comprise suitable logic, circuitry, and/or code that may enable support for frame processing for decoding bit sequences in redundancy-based algorithms. For voice data processing, for example, frame processing may enable decoding of a block using 8 bursts of data for full rate voice channels or 4 bursts of data for half rate voice channels. The redundancy-based FP block 406d may also enable the generation of a redundancy verification parameter, such as a CRC, or continuity and smoothness of the speech parameters, for example, for the decoded bit sequence. The redundancy-based FP block 406d may also support iterative processing by communicating a portion of the frame processing results to the redundancy-based BP block 404a as described in FIGS. 3A and 3B, for example. The decoded bit sequence generated by the redundancy-based FP block 406d may be communicated to the higher level process block 410 for further processing.

The burst selector 412 may comprise suitable logic, circuitry, and/or code that may enable the selection of either the processed bit sequence that results from the portion of the SAIC decoding path 404 that performs burst processing or the processed bit sequence that results from the portion of the redundancy-based decoding path 406 that performs burst processing. In this regard, the burst selector 412 may perform selection by utilizing a burst-by-burst approach, for example. In this exemplary implementation, the burst selector 412 may select the output of the MSLE EQ 404b in the SAIC decoding path 404 or the output of the redundancy-based BP block 406b in the redundancy-based decoding path 406. The burst selector 412 may utilize SNR measurements, for example, to perform the selection. For example, the burst selector 412 may select the processed burst with the highest SNR. In some instances, the burst selector 412 may utilize received level signal strength measurements to perform the selection.

The burst selector 412 may enable communication of the selected processed bit sequence to a remaining portion of the decoding path from which the selected processed bit sequence was obtained. In this regard, the burst selector 412 may generate at least one signal to enable communicating the processed burst to the corresponding frame processing. For example, when the selected processed bit sequence results from the MSLE EQ 404b in the SAIC decoding path 404, the burst selector 412 may activate the first switch 414a by utilizing the signal 416a. When the first switch 414a is activated, the processed bit sequence from the MSLE EQ 404b may be communicated to the loading de-interleaver 404c in the SAIC decoding path 404. In this regard, only the SAIC decoding path 404 may generate a decoded bit sequence that may be communicated to the higher level process block 410 for further processing. Moreover, when the first switch 414a is activated, processed bursts stored in the burst buffer 420 may also be communicated to the loading de-interleaver 404c via the first switch 414a.

In another example, when the selected processed bit sequence results from the redundancy-based FP block 406b in the redundancy-based decoding path 406, the burst selector 412 may activate the second switch 414b by utilizing the signal 416b. When the second switch 414b is activated, the processed bit sequence from the redundancy-based BP block 406b may be communicated to the loading de-interleaver 406c in the redundancy-based decoding path 406. In this regard, only the redundancy-based decoding path 406 may generate a decoded bit sequence that may be communicated to the higher level process block 410 for further processing. Moreover, when the second switch 414b is activated, processed bursts stored in the burst buffer 420 may also be communicated to the loading de-interleaver 406c via the second switch 414b.

The burst selector 412 may also enable selecting the output of the MSLE EQ 404b in the SAIC decoding path 404 or the output of the redundancy-based BP block 406b in the redundancy-based decoding path 406 based on previously selected bursts. For example, the burst selector 412 may select a burst that may result in a higher quality metric, such as SNR, for example, of a frame to be processed in the frame processing portion of the corresponding decoding algorithm.

Figure 5:
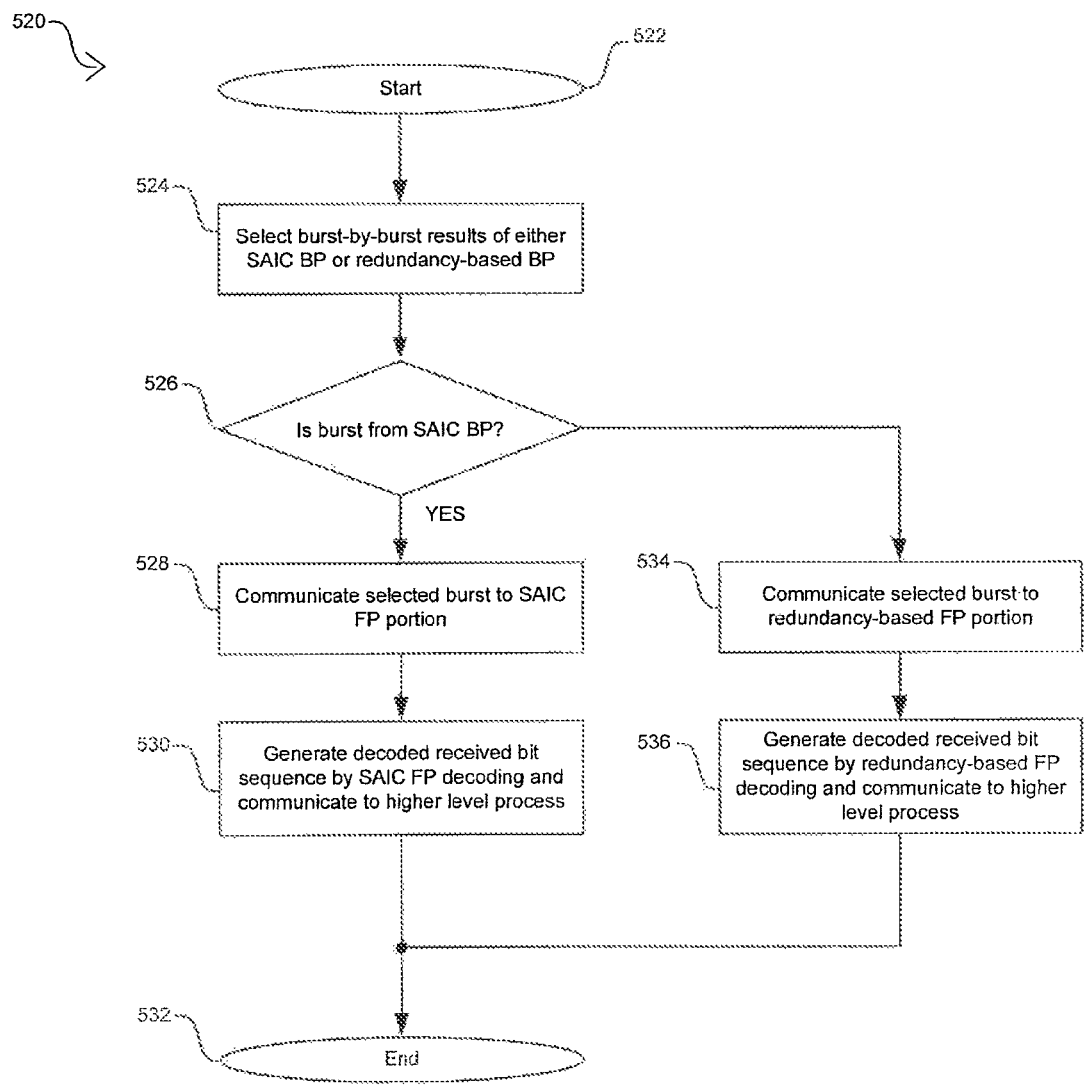
FIG. 5 is a flow diagram illustrating another exemplary steps in the operation of a parallel adaptation of SAIC and redundancy-based decoding algorithms with a burst selector, in accordance with an embodiment of the invention.

FIG. 5 is a flow diagram illustrating exemplary steps in the operation of a parallel adaptation of SAIC and redundancy-based decoding algorithms with a burst selector, in accordance with an embodiment of the invention. Referring to FIG. 5, after start step 522, in step 524, the burst processor 412 in FIG. 4 may select, based on a burst-by-burst approach, for example, either a processed burst that results from the burst processing performed by a portion of the SAIC decoding path 404 or a processed burst that results from the burst processing performed by a portion of the redundancy-based decoding path 406. In step 526, when the processed burst selected results from a burst processing performed by a portion of the SAIC decoding path 404, the process may proceed to step 528.

In step 528, the selected processed burst or processed bit sequence may be communicated to the remaining portion of the SAIC decoding path 404 that performs frame processing. In this instance, the processed burst may be communicated to the burst buffering de-interleaver 404c via the first switch 414a when the first switch 414a is activated by the burst selector 412 utilizing the signal 416a. In step 530, the frame processing portion of the SAIC decoding path 404 may generate a decoded bit sequence. The decoded bit sequence that results from the frame processing portion of the SAIC decoding path 404 may be communicated to the higher level process block 410 for further processing.

Returning to step 526, when the processed burst selected results from a burst processing performed by a portion of the redundancy-based decoding path 406, the process may proceed to step 534. In step 534, the selected processed burst or processed bit sequence may be communicated to the remaining portion of the redundancy-based decoding path 406 that performs frame processing. In this instance, the processed burst may be communicated to the burst buffering de-interleaver 406c via the second switch 414b when the second switch 414b is activated by the burst selector 412 utilizing the signal 416b. In step 536, the frame processing portion of the redundancy-based decoding path 406 may generate a decoded bit sequence. The decoded bit sequence that results from the frame processing portion of the redundancy-based decoding path 406 may be communicated to the higher level process block 410 for further processing.

Figure 6:
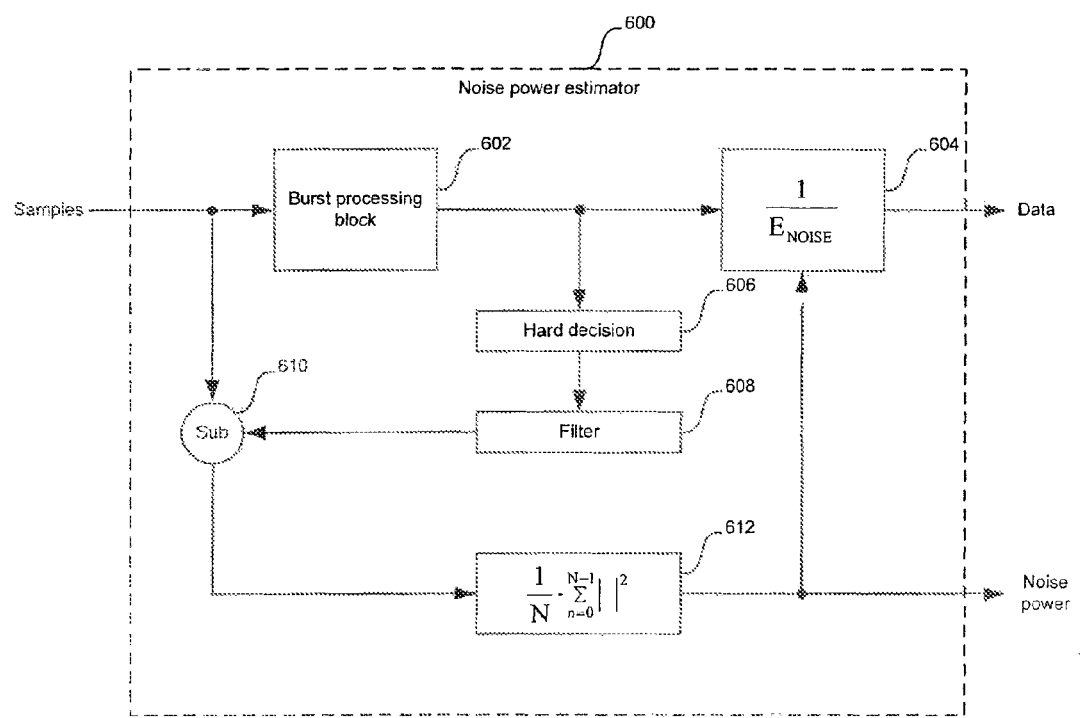
FIG. 6 is a block diagram illustrating an exemplary noise power estimator for redundancy-based burst processing, in accordance with an embodiment of the invention.

FIG. 6 is a block diagram illustrating an exemplary noise power estimator for the redundancy-based burst processing, in accordance with an embodiment of the invention. Referring to FIG. 6, there is shown a noise power estimator 600 for determining SNR for redundancy-based processed bursts that may comprise a burst processing block 602, a noise factor block 604, a hard decision block 606, a filter 608, a subtractor 610, and a noise power block 612. The noise power estimator 600 may comprise suitable logic, circuitry, and/or code that may enable determining the SNR and/or the noise power estimation for received samples or received bit sequences from redundancy-based burst processing operations. In this regard, the results from the noise power estimator 600 may be utilized by the burst selector 412 for selecting processed bursts for frame processing, for example. In this regard, the noise power estimator 600 may generate a SNR that may be described by the expression:

$$SNR = \frac{E_{SYM}}{E_{NOISE}}, \tag{1}$$

where $E_{SYM}$ represents the signal power estimate and $E_{NOISE}$ represents the noise power estimate. The signal power estimate may be determined based on the following expression:

$$E_{SYM} = \sum_{n=0}^{N-1} |W_n|^2, \tag{2}$$

where W represents the received symbol or bit sequence waveform and N represents the number of symbols received.

For SAIC burst processing operations, the received symbol W for estimating the signal may result from the convolution of a transmitted symbol waveform $W_{TX}$ and a channel impulse response H as given by the expression:

$$W = W_{TX} * H. \tag{3}$$

For SAIC decoding, the received symbol waveform may correspond to the real part of the output that results from the convolution of a transmitted symbol waveform $W_{TX}$, a channel impulse response H and prefilter impulse response PF, as given by the expression:

$$W = Re(PF * W_{TX} * H). \tag{4}$$

The noise power estimate for SAIC processed bursts may be based on the difference between the received samples, SamplesIn, and estimates of the received samples, SamplesEst. The noise power estimate generated for SAIC burst processing may be given by the following expression:

$$E_{NOISE} = \frac{1}{N} \times \sum_{n=0}^{N-1} |SamplesIn\text{-}SamplesEst|^2, \tag{5}$$

where the estimated samples may be defined as the convolution of the received symbol waveform W and the received data estimation $\hat{D}$ as given by the expression:

$$SamplesEst = W * \hat{D}. \tag{6}$$

In some instances, an equalizer, such as a Viterbi equalizer, for example, may be utilized to obtain received data estimates that may provide information regarding a minimum distance between the received and the estimated samples vector, that is, minimal estimated noise power. When the minimal estimated noise power, minimal, is available, the noise power estimate may be given by the expression:

$$E_{NOISE} = \frac{1}{N} \times \sum_{n=0}^{N-1} |SamplesIn\text{-}SamplesEst|^2 - minimal. \tag{7}$$

The condition represented by equation (7) may be equivalent to a maximum correlation condition given by the following expression:

$$\frac{1}{N} \cdot \sum_{n=0}^{N-1} |SamplesIn\text{-}SamplesEst|^2 = \frac{1}{N} \cdot \sum_{n=0}^{N-1} |SamplesIn|^2 - \frac{2}{N} \cdot \sum_{n=0}^{N-1} SamplesIn \times SamplesEst + \frac{1}{N} \cdot \sum_{n=0}^{N-1} |SamplesEst|^2. \quad (8)$$

As a result of the condition described in equation (8), a path metric, PathMetric, that may result from a Viterbi equalizer, for example, may be proportional to the minimum distance or to the maximum correlation between the received samples, SamplesIn, and estimates of the received samples, SamplesEst. The value of PathMetric from a Viterbi equalizer, for example, may be given by the following expressions:

$$PathMetric = Gain \times \sum_{n=0}^{N-1} |SamplesIn\text{-}SamplesEst|^2, \text{ or} \quad (9a)$$

$$PathMetric = Gain \times \sum_{n=0}^{N-1} SamplesIn \times SamplesEst. \quad (9b)$$

From the expressions in equation (9a) and (9b), the estimated noise power may also be determined from an equalizer's output path metric and the SNR is calculated by using equation (1), equation (2), equation (4), equation (5), and/or equation (9a), for example.

The adaptation of single antenna interference cancellation and redundancy-based decoding algorithms in a single wireless receiver by utilizing the quality of the results of the burst processing portion of each of the algorithms may provide sufficient flexibility to improve the performance of optimized receivers for decoding interdependent encoded data while also enabling the reduction of signal interference without extensive and costly increases in hardware and/or software complexity.

In one embodiment of the invention, aspects of a system may comprise at least one processor that enables processing of a received bit sequence using a first burst process operation in a portion of a first decoding algorithm. The first decoding algorithm may utilize redundancy and/or may impose at least one physical constraint during decoding, for example. The physical constraint may be related to a type of data in the received bit sequence. The processor may enable processing of the received bit sequence using a second BP operation in a portion of a second decoding algorithm. The second decoding algorithm may utilize single antenna interference cancellation (SAIC), for example. The processor may also enable applying one of: the processed received bit sequence resulting from the first BP operation and the processed received bit sequence resulting from the second BP operation to a remaining portion of at least one of the first decoding algorithm and the second decoding algorithm.

The processor may enable applying a processed received bit sequence to a first frame process (FP) operation in the first decoding algorithm and to a second FP operation in the second decoding algorithm. The processor may enable applying the processed received bit sequence to a first FP operation in the first decoding algorithm when the processed received bit sequence resulting from the first BP operation is selected. The processor may enable applying the processed received bit sequence to a second FP operation in the second decoding algorithm when the processed received bit sequence resulting from the second BP operation is selected.

The processor may enable determining whether to apply the processed received bit sequence resulting from the first BP operation or the processed received bit sequence resulting from the second BP operation based on a signal-to-noise ratio (SNR) measurement for each of the processed received bit sequences. Moreover, the processor may also enable determining whether to apply the processed received bit sequence resulting from the first BP operation or the processed received bit sequence resulting from the second BP operation based on at least one previously applied processed received bit sequence to be processed in a same frame in a frame process operation.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
processing, with a first decoding device, a bit sequence using a portion of a first decoding algorithm to generate a first processed bit sequence, the first decoding algorithm utilizing redundancy and at least one physical constraint associated with the bit sequence;
processing, with a second decoding device, the bit sequence using a portion of a second decoding algorithm to generate a second processed bit sequence, the second decoding algorithm utilizing single antenna interference cancellation; and
selecting the first processed bit sequence or the second processed bit sequence based on one or more signal characteristics associated with each of the first and second processed bit sequences.

2. The method of claim 1, further comprising:
applying the selected processed first or second bit sequence to a remaining portion of the first decoding algorithm or the second decoding algorithm.

3. The method of claim 1, wherein the processing the bit sequence using the first decoding algorithm and the processing the bit sequence using the second decoding algorithm comprise applying a third processed bit sequence from a previously-processed frame during at least one of the first decoding algorithm, the second decoding algorithm, or both the first and second decoding algorithms.

4. The method of claim 1, wherein the processing the bit sequence using the first decoding algorithm comprises decoding the bit sequence using the at least one physical constraint, the at least one physical constraint being related to a type of data associated with the bit sequence.

5. The method of claim 1, wherein the selecting comprises selecting either the first processed bit sequence or the second processed bit sequence on a burst-by-burst basis.

6. The method of claim 1, wherein the selecting comprises selecting the first processed bit sequence or the second processed bit sequence based on the bit sequence with the highest signal-to-noise ratio.

7. The method of claim 1, wherein the selecting comprises calculating a signal-to-noise ratio associated with each of the first and second processed bit sequences by dividing a signal power estimate of a respective bit sequence by a noise power estimate of the respective bit sequence.

8. A machine-readable storage having stored thereon, a computer program having at least one code section for signal processing, the at least one code section being executable by a machine for causing the machine to perform steps comprising:
processing a bit sequence using a portion of a first decoding algorithm to generate a first processed bit sequence, the first decoding algorithm utilizing redundancy and at least one physical constraint associated with the bit sequence;
processing the bit sequence using a portion of a second decoding algorithm to generate a second processed bit sequence, the second decoding algorithm utilizing single antenna interference cancellation; and
selecting the first processed bit sequence or the second processed bit sequence based on one or more signal characteristics associated with each of the first and second processed bit sequences.

9. The machine-readable storage of claim 8, wherein the at least one code section being executable by a machine for causing the machine to perform steps further comprises:
applying the selected processed first or second bit sequence to a remaining portion of the first decoding algorithm or the second decoding algorithm.

10. The machine-readable storage of claim 8, wherein the processing the bit sequence using the first decoding algorithm and the processing the bit sequence the second decoding algorithm comprise applying a third processed bit sequence from a previously-processed frame during at least one of the first decoding algorithm, the second decoding algorithm, or both the first and second decoding algorithms.

11. The machine-readable storage of claim 8, wherein the processing the bit sequence using the first decoding algorithm comprises decoding the bit sequence using the at least one physical constraint, the at least one physical constraint being related to a type of data associated with the bit sequence.

12. The machine-readable storage of claim 8, wherein the selecting comprises selecting either the first processed bit sequence or the second processed bit sequence on a burst-by-burst basis.

13. The machine-readable storage of claim 8, wherein the selecting comprises selecting the first processed bit sequence or the second processed bit sequence based on the bit sequence with the highest signal-to-noise ratio.

14. The machine-readable storage of claim 8, wherein the selecting comprises calculating a signal-to-noise ratio associated with each of the first and second processed bit sequences by dividing a signal power estimate of a respective bit sequence by a noise power estimate of the respective bit sequence.

15. A system for signal processing, the system comprising:
a first decoding device configured to process a bit sequence using a portion of a first decoding algorithm to generate a first processed bit sequence, the first decoding algorithm utilizing redundancy and at least one physical constraint associated with the bit sequence;
a second decoding device configured to process the bit sequence using a portion of a second decoding algorithm to generate a second processed bit sequence, the second decoding algorithm utilizing single antenna interference cancellation; and
a selector device configured to select the first processed bit sequence or the second processed bit sequence based on one or more signal characteristics associated with each of the first and second processed bit sequences.

16. The system of claim 15, further comprising:
a processing device configured to apply the selected processed first or second bit sequence to a remaining portion of the first decoding algorithm or the second decoding algorithm.

17. The system of claim 15, wherein the first decoding device and the second decoding device are configured to apply a third processed bit sequence from a previously-processed frame during at least one of the first decoding algorithm, the second decoding algorithm, or both the first and second decoding algorithms.

18. The system of claim 15, wherein the first decoding device is configured to decode the bit sequence using the at least one physical constraint, the at least one physical constraint being related to a type of data associated with the bit sequence.

19. The system of claim 15, wherein the selector device is configured to select either the first processed bit sequence or the second processed bit sequence on a burst-by-burst basis.

20. The system of claim 15, wherein the selector device is configured to select the first processed bit sequence or the second processed bit sequence based on the bit sequence with the highest signal-to-noise ratio.

21. The system of claim 15, wherein the selector device is configured to calculate a signal-to-noise ratio associated with each of the first and second processed bit sequences by dividing a signal power estimate of a respective bit sequence by a noise power estimate of the respective bit sequence.

* * * * *

UNITED STATES PATENT AND TRADEMARK OFFICE
CERTIFICATE OF CORRECTION

| | | |
|---|---|---|
| PATENT NO. | : 8,582,697 B2 | Page 1 of 1 |
| APPLICATION NO. | : 13/614338 | |
| DATED | : November 12, 2013 | |
| INVENTOR(S) | : Arie Heiman et al. | |

It is certified that error appears in the above-identified patent and that said Letters Patent is hereby corrected as shown below:

In the Claims:

Column 15, line 55, "bit sequence the second" should be replaced with --bit sequence using the second--.

Signed and Sealed this
Eleventh Day of February, 2014

Michelle K. Lee
*Deputy Director of the United States Patent and Trademark Office*